(12) United States Patent
Kobayashi et al.

(10) Patent No.: US 7,052,929 B2
(45) Date of Patent: May 30, 2006

(54) SOLID STATE IMAGE PICKUP DEVICE CAPABLE OF SUPPRESSING SMEAR

(75) Inventors: Makoto Kobayashi, Miyagi (JP); Katsumi Ikeda, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 12 days.

(21) Appl. No.: 11/183,859

(22) Filed: Jul. 19, 2005

(65) Prior Publication Data

US 2006/0035401 A1    Feb. 16, 2006

(30) Foreign Application Priority Data

Aug. 12, 2004    (JP)  ............................. 2004-235104

(51) Int. Cl.
*H01L 21/00*    (2006.01)

(52) U.S. Cl. .......................................... 438/60; 438/70
(58) Field of Classification Search ................ 438/60, 438/75, 48; 257/233
See application file for complete search history.

(56) References Cited

U.S. PATENT DOCUMENTS 6,236,434 B1    5/2001 Yamada
6,551,910 B1*   4/2003 Ohashi ........................ 438/519
6,680,222 B1*   1/2004 Hynecek ..................... 438/144
6,746,939 B1*   6/2004 Shimozono et al. ........ 438/471

FOREIGN PATENT DOCUMENTS

JP    7-322143 A    12/1995
JP    2003-060185 A    2/2003

* cited by examiner

Primary Examiner—Phat X. Cao
(74) Attorney, Agent, or Firm—Birch, Stewart, Kolasch & Birch, LLP (57) ABSTRACT

A driving method for a solid state image pickup device, having four or more transfer stages as one transfer unit, includes reading signal charge from the charge accumulation regions to the vertical charge transfer channels. The reading step includes (b-1) applying the barrier forming voltage to a first transfer electrode to form a barrier of at least one stage per the transfer unit; (b-2) applying the read pulse to a second transfer electrode to read signal charge from a corresponding charge accumulation region to a corresponding vertical charge transfer channel; and (b-3) applying a cancellation pulse to a third transfer electrode spaced by at least one transfer stage from the first transfer electrode, the cancellation pulse cancelling out a potential change in the charge accumulation region to be caused by the read pulse.

10 Claims, 6 Drawing Sheets

SOLID STATE IMAGE PICKUP DEVICE CAPABLE OF SUPPRESSING SMEAR

CROSS REFERENCE TO RELATED APPLICATION

This application is based on and claims priority of Japanese Patent Application No. 2004-235104 filed on Aug. 12, 2004, the entire contents of which are incorporated herein by reference.

BACKGROUND OF THE INVENTION

A) Field of the Invention

The present invention relates to a driving method for a solid state image pickup device, and more particularly to a driving method for a solid state image pickup device capable of lowering a pulse voltage for reading signal charge from a charge accumulation area to a charge transfer channel.

B) Description of the Related Art

Solid state image pickup devices are widely used in which photodiodes are disposed on a semiconductor substrate in a matrix shape and images are picked up by converting optical images into signal charge. In a charge coupled device (CCD) type solid state image pickup device, a plurality of vertical charge transfer channels are disposed near corresponding photodiode columns, and a horizontal charge transfer channel is coupled to one ends of the vertical charge transfer channels. Read/transfer voltages are applied to transfer electrodes above the charge transfer channels so that signal charge is read from the photodiodes to the vertical charge transfer channels and sequentially output via the vertical charge transfer channels and the horizontal charge transfer channel.

Each photodiode takes an electrically floating state in the semiconductor substrate and capacitively couples a peripheral region. Therefore, a potential of the photodiode varies with a peripheral potential. In order to completely read signal charge accumulated in the photodiode, a sufficiently high voltage, e.g., a voltage of +15 V, is applied to the read/transfer electrode. It is generally desired to lower a drive voltage in order to reduce the consumption power of a solid state image pickup device.

If a read pulse is merely lowered, accumulated charge cannot be read completely from a photodiode. If imaging is performed continuously such as a movie operation and part of the signal charge is left in photodiodes, this residual charge is mixed with subsequently accumulated signal charge, and an image with an afterimage is picked up. The afterimage causes considerable degradation of an image. It is desired to completely deplete a photodiodes when signal charge is read and to lower a read pulse voltage.

It is known to apply a cancellation pulse which cancels at least a portion of the influence of a read pulse, as a method of lowering a minimum depletion voltage which is a minimum voltage necessary for depleting a photodiode.

Figure 4A:
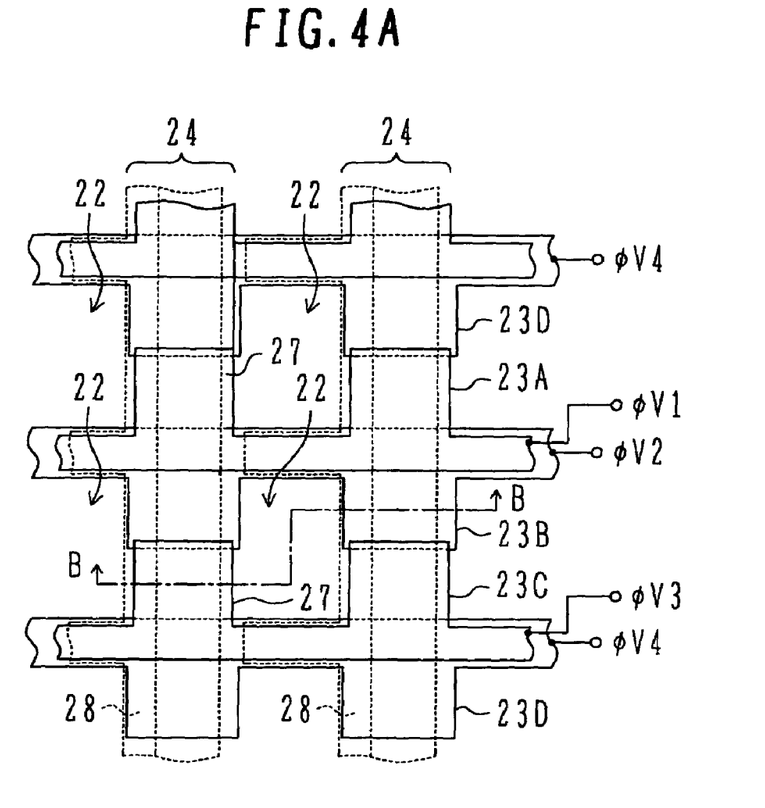
FIGS. 4A to 4D are a plan view, a cross sectional view and graphs illustrating a driving method for a solid state image pickup device according to prior art.

FIGS. 4A to 4D illustrate a driving method for a solid state image pickup device proposed by Japanese Patent Laid-open Publication No. HEI-7-322143. FIG. 4A is a partial plan view of a solid state image pickup device. A number of photodiode sensors 22 are disposed on a surface of a semiconductor substrate in a square (tetragonal) matrix shape, and vertical transfer registers 24 are disposed to the left of sensor columns. A read gate 27 is disposed between each sensor 22 and a corresponding vertical transfer register 24. A channel stop 28 is formed between each sensor column and the vertical transfer register column and to the right of the sensor column, to achieve electric separation.

Each vertical transfer register 24 is provided with transfer electrodes 23 disposed above the semiconductor substrate surface via an insulating layer. The transfer electrodes 23 include transfer electrodes 23B and 23D made of a first polysilicon layer and transfer electrodes 23A and 23C made of a second polysilicon layer. Four-phase drive voltages □V1 to □V4 are applied to the electrodes 23A to 23D.

Figure 4B:
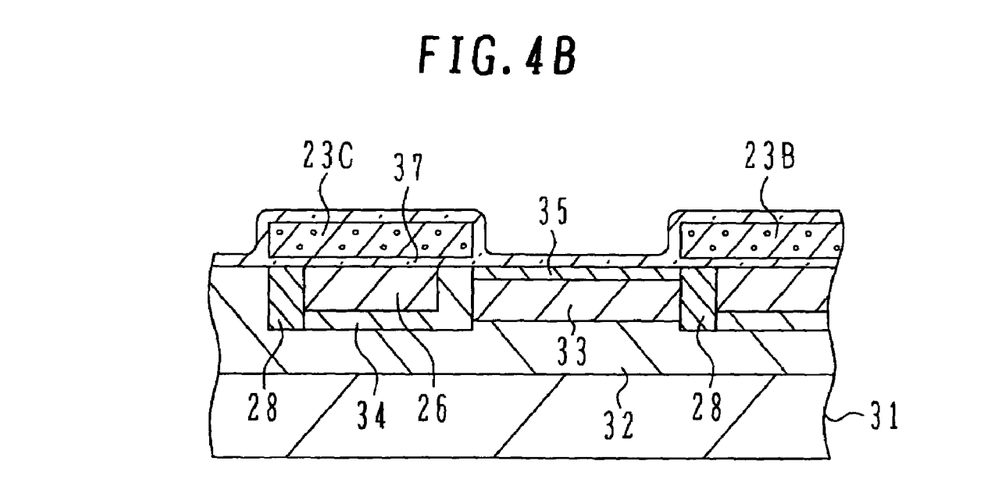

FIG. 4B is a cross sectional view taken along line B—B shown in FIG. 4A. A p-type well 32 is formed in an n-type silicon substrate 31 and an n-type diffusion region 33 is formed in the p-type well 32, to thereby form a pn junction photodiode. The n-type diffusion region 33 is a charge (electron) accumulation region. A p-type diffusion region 35 is a burying or covering region to separate the n-type diffusion region 33 from the substrate surface. A p-type well 34 is formed next to the n-type diffusion region 33 of the photodiode, and an n-type diffusion region 26 is formed in the p-type well 34, to constitute a transfer channel of the vertical transfer register.

The p-type well 34 between the n-type diffusion region 33 of the photodiode and the transfer channel 26 constitutes a read gate. A p-channel channel stop 28 is formed between columns to electrically isolate the columns. The transfer electrodes 23B and 23C are disposed above the transfer channels 26 via insulating films. No transfer electrode 23 is disposed above the n-type diffusion region 33 of the photodiode, and a window for incidence light is formed above this region.

Figure 4C:
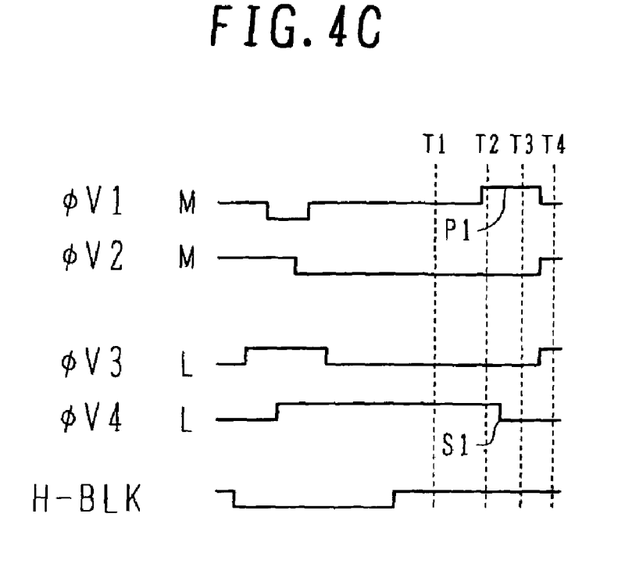
Figure 4D:
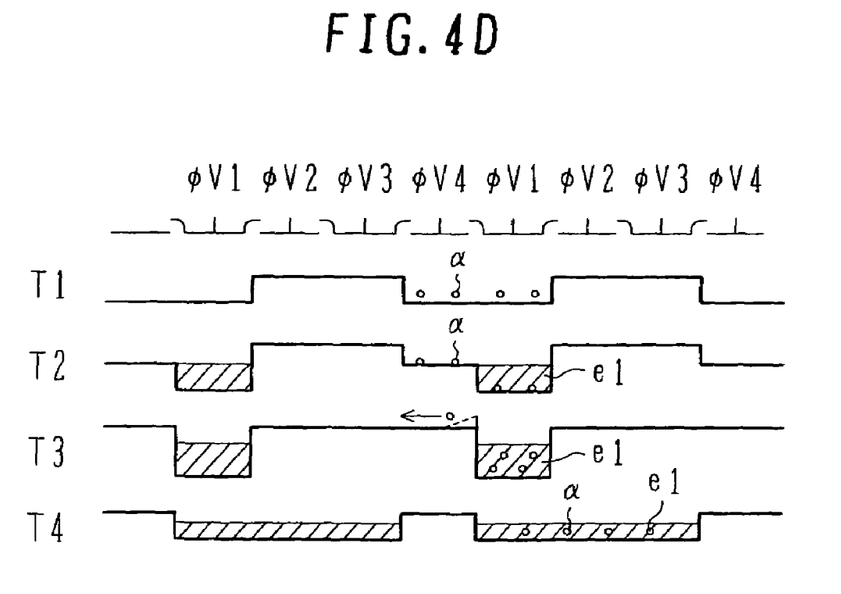

FIG. 4C shows waveforms of the drive voltages □V1 to □V4 show in FIG. 4A and a horizontal blanking signal H-BLK. A timing T1 is immediately before read, and read is performed at timings T2 and T3. A timing T4 is a transfer standby state after the read operation. FIG. 4D shows a potential distribution and a charge distribution in the transfer channel during timings T1 to T4. Since a potential relative to electrons is shown, the sign is reversed from that of each voltage shown in FIG. 4C.

At the timing T1, □V2 and □V3 applied to the electrodes adjacent to a sensor not to be read are at a low voltage level and form a barrier having a high potential relative to electrons, whereas □V4 and □V1 applied to the electrodes adjacent to a sensor to be read are at a middle voltage level and form a well having a low potential relative to electrons. Smear charge □ is shown in the well. The smear charge corresponds to adjacent sensors. If the smear charge is mixed with signal charge to be read, there is no problem. However, if the smear charge is moved (redistributed) along the column direction, the image quality is degraded.

At the timing T2, a read pulse P1 at a high voltage level is superposed upon □V1. The potential in the transfer channel lowers to remove the barrier of the read gate and read charge e1 of the photodiode. However, application of the read pulse at a high voltage level raises the voltage level (lowers the potential) of the photodiode so that charge is left in the photodiode.

After the read pulse is applied, a modulation (cancellation) pulse S1 of an opposite polarity is superposed upon □V4. For example, the voltage of the pulse S1 is the same as the voltage at the low voltage level. The modulation pulse S1 has a function of lowering the voltage level (raising the potential) of the photodiode. Therefore, residual charge in the photodiode is read to the transfer channel. Although there is residual charge if the read pulse only is used, all charge can be read by applying the modulation pulse. This means a lowered minimum depletion voltage.

At the timing T2 when reading signal charge from the sensor starts, the smear charge □ is left in a low potential region □V4. The above-cited Publication explains that as the modulation pulse is applied at the timing T3, the potential of □V4 rises so that the smear charge is collected under the low potential □V1 region and charge redistribution will not occur. At the timing T4, the well expands from □V1 to □V3 so that transfer can start.

SUMMARY OF THE INVENTION

An object of this invention is to provide a driving method for a solid state image pickup device capable of lowering a minimum depletion voltage and preventing redistribution of smear charge.

According to one aspect of the present invention, there is provided a driving method for a solid state image pickup device having a number of charge accumulation regions formed in a surface region of a first conductivity type in a semiconductor substrate in a matrix shape, the charge accumulation region being of a second conductivity type opposite to the first conductivity type, a plurality of vertical charge transfer channels of the second conductivity type formed adjacent to each column of the charge accumulation regions in the surface region, a read gate of the first conductivity type disposed in the surface region between each charge accumulation region and a corresponding vertical charge transfer channel, and a plurality of transfer electrodes disposed above each vertical charge transfer channel, crossing each vertical charge transfer channel, extending in a row direction, defining two or more transfer stages per one charge accumulation region in the vertical charge transfer channels, being capable of transferring charge by selectively applying a barrier forming voltage and a charge accumulation voltage and reading signal charge from a charge accumulation region to a transfer stage by applying a read pulse to the transfer stage corresponding to the read gate, the driving method comprising: (a) a step of focussing an optical image on the charge accumulation regions to accumulate signal charge; (b) a step of reading signal charge from the charge accumulation regions to the vertical charge transfer channels by using four or more transfer stages as one transfer unit, the reading step comprising steps of: (b-1) applying the barrier forming voltage to a predetermined transfer electrode to form a barrier of at least one stage per the transfer unit; (b-2) applying the read pulse to a predetermined transfer electrode to read signal charge from a corresponding charge accumulation region to a corresponding vertical charge transfer channel; and (b-3) applying a cancellation pulse to a predetermined transfer electrode spaced by at least one transfer stage from the transfer electrode applied with the barrier forming voltage, the cancellation pulse cancelling out a potential change in the charge accumulation region to be caused by the read pulse.

Even if the vertical charge transfer channel has potential irregularity, moving smear charge can be trapped in a low potential region by applying the cancellation pulse and will not be mixed with neighboring signal charge. Smear charge is combined with corresponding signal charge after the cancellation pulse extinguishes.

DESCRIPTION OF THE PREFERRED EMBODIMENTS

The present inventors have found that as a cancellation pulse, at the voltage level under the same condition as that of the barrier forming voltage, is applied to electrodes adjacent to the barrier forming electrodes, signal irregularity called smear irregularity appears in the whole photosensor area. This reason has been studied and the following possibility has been found.

If transfer channels are formed perfectly uniform, it may be possible as described earlier to lower the minimum depletion voltage and prevent redistribution of smear charge. However, potential irregularity of transfer channels may occur due to a variation in manufacture processes. As indicated by a broken line in the potential distribution at the timing T3 shown in FIG. 4C, it is assumed that the potential is slightly high on the downstream side of the potential region □V4. In this case, as the cancellation pulse is applied, smear charge is transferred to the upstream potential well.

Even if the potential is not irregular, it is uncertain that smear charge under the electrode applied with the cancellation pulse moves to which direction. During the period while the barrier exists along the travel direction, travelling smear charge is blocked at the barrier. However, if the potential in the channel region changes fast as the cancellation pulse is applied, it may occur that there is no potential difference between the region under the cancellation pulse applied electrode and the region under the barrier forming voltage applied electrodes, when the smear charge arrives the barrier. In this case, the smear charge rides over the barrier and is mixed with the upstream charge. This phenomena occur because the cancellation pulse is applied to the electrode adjacent to the barrier forming electrodes.

Embodiments of the present invention will be described with reference to the accompanying drawings.

FIGS. 1A to 1D are plan views and cross sectional views showing the structure of a solid state image pickup device used with embodiments of the present invention. The structure of the solid state image pickup device shown in FIGS. 1A to 1D is well known.

Figure 1A:
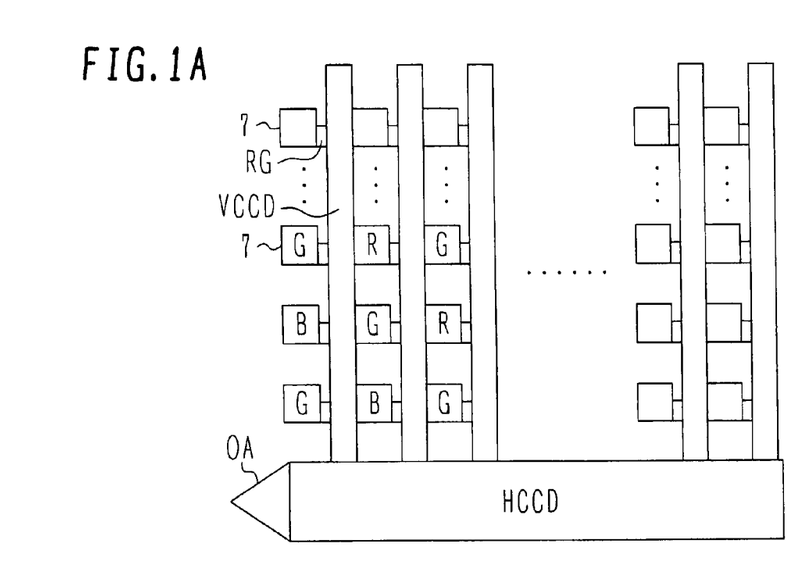
FIGS. 1A to 1D are plan views and cross sectional views briefly showing the structure of a solid state image pickup device used with embodiments of the present invention.

As shown in FIG. 1A, n-type charge accumulation regions 7 constituting photodiodes are disposed in a tetragonal matrix shape in a surface region of a silicon substrate. A vertical charge transfer channel VCCD is disposed along each column of charge accumulation regions. A read gate RG of a p-type region is formed between each charge accumulation region and VCCD.

A horizontal charge transfer channel HCCD is coupled to one ends of a plurality of VCCDs disposed along columns of the charge accumulation regions 7. An output amplifier OA is connected to an output terminal of the horizontal charge transfer channel HCCD. The charge accumulation regions 7 are a photosensor area, and color filters of red (R), green (G) and blue (B) and the like of a Bayer layout or the like are formed above the photosensor area. The colors of the color filters are represented by R, G and B affixed to the charge accumulation regions shown in FIG. 1A. Above the color filters, on-chip micro lenses are formed. For general information of the solid state image pickup device of this type, for example, refer to Japanese Patent Laid-open Publication No. 2003-60185 which is incorporated herein by reference.

Figure 1B:
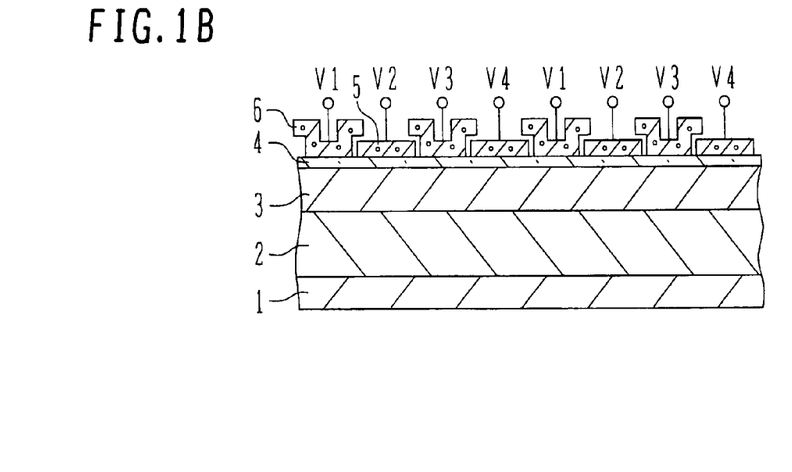

FIG. 1B is a cross sectional view along an extension direction of the vertical charge transfer channel VCCD. A p-type well 2 is formed in a surface region of the n-type silicon substrate 1, and in a surface region of the p-type well, an n-type region 3 is formed to constitute a channel region of the vertical charge transfer channel VCCD.

Transfer electrodes made of a first polysilicon layer 5 and a second polysilicon layer 6 are formed above the silicon substrate surface via insulating films 4. In the layout shown in FIG. 1A, a wiring region stacking the first and second polysilicon layers 5 and 6 is formed between adjacent charge accumulation regions in the column direction. As shown in FIG. 1B, above VCCD, the first and second polysilicon layers 5 and 6 are disposed in different areas to define respective transfer stages, and only the border portions are overlapped. Four-phase drive pulses are applied to the transfer electrodes. The transfer electrodes are represented by V1, V2, V3 and V4.

Figure 1C:
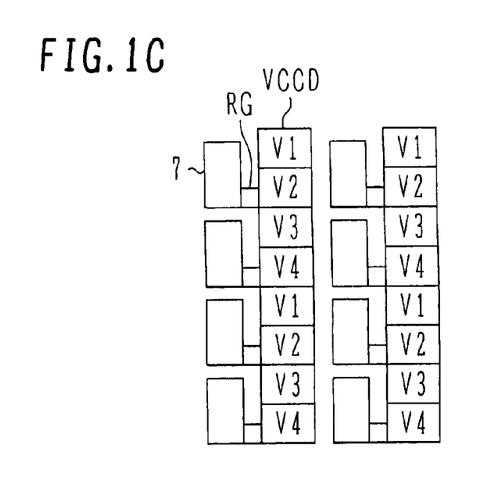

FIG. 1C is a schematic diagram showing the state that transfer stages V1 to V4 are defined in the vertical transfer channel under the transfer electrodes. The effective arrangements of the transfer stages V1 to V4 and the transfer electrodes V1 to V4 are coincident as viewed in plan. Two transfer stages per each charge accumulation region are formed in the vertical charge transfer channel VCCD, and one transfer unit is constituted of four transfer stages. Two charge accumulation regions are coupled in one transfer unit. In each read operation, one of two charge accumulation regions is read.

Figure 1D:
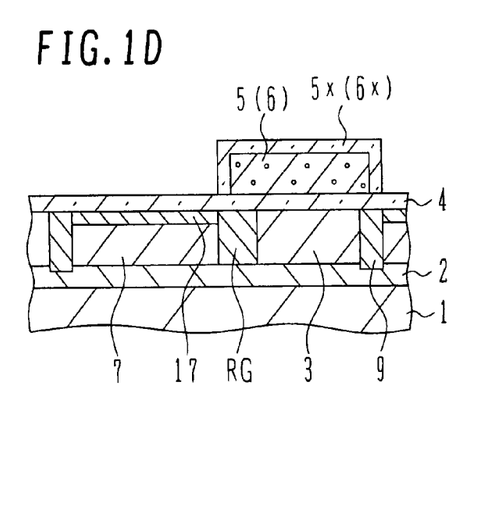

FIG. 1D is a cross sectional view of a photodiode taken along a row direction passing through a charge accumulation region 7. An n-type region 7 constituting the charge accumulation region of the photodiode is formed in a p-type well 2 formed in a surface region of an n-type silicon substrate, to thereby form a through-substrate drain shutter mechanism analogous to a vertical bipolar transistor. As a positive high voltage is applied to the n-type substrate, the barrier formed by the p-type well 2 extinguishes so that charge accumulated in the charge accumulation region 7 can be drained to the substrate.

An n-type region 3 constituting a channel region of the vertical charge transfer channel is formed in the p-type well adjacent to the charge accumulation region 7. The surface of the n-type region is separated from the substrate surface by a p-type burying or covering region 17 to improve a charge retention performance. A p-type gate region RG is formed between the charge accumulation region 7 and channel region 3. A channel stop 9 having a high p-type impurity concentration is formed between adjacent columns.

A transfer electrode 5 (6) made of a first polysilicon layer or a second polysilicon layer is formed above the channel region 3 via an insulating film 4 such as a stacked layer of an oxide film/a nitride film/an oxide film (ONO film), to thereby constitute a charge coupled device (CCD). The surface of the transfer electrode 5 (6) is covered with an insulating layer 5x (6x) such as a thermally oxidized film.

The structure of the solid state image pickup of this type is well known and the structures of various well-known solid state image pickup devices can be adopted.

Figure 2A:
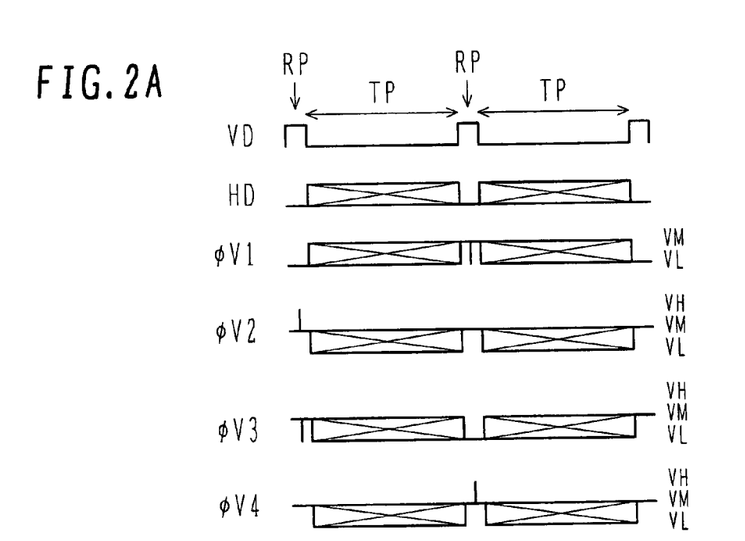
FIGS. 2A to 2C are graphs illustrating a driving method for a solid state image pickup device according to an embodiment of the present invention.
Figure 2B:
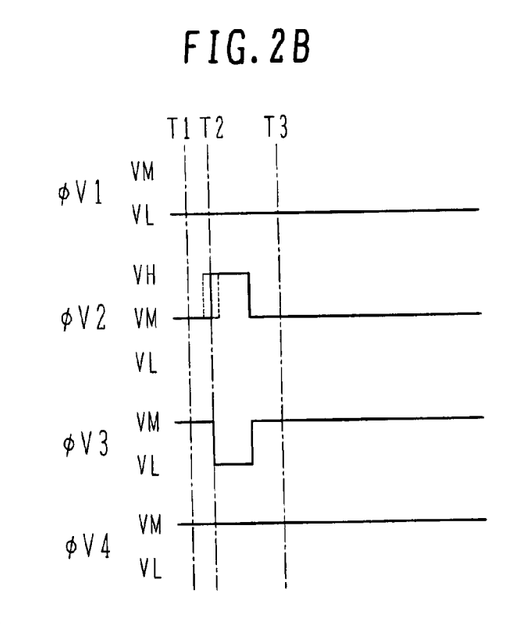
Figure 2C:
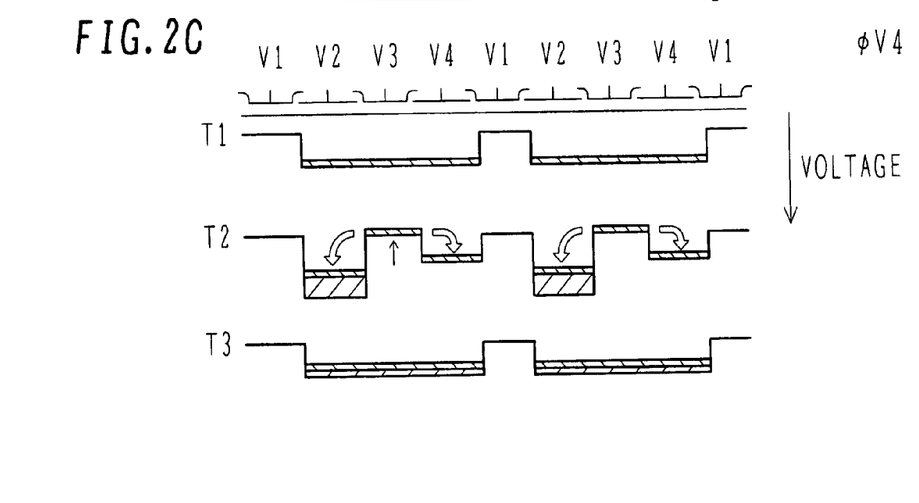

FIGS. 2A to 2C are graphs briefly illustrating a driving method, particularly a charge reading method for the solid state image pickup device shown in FIGS. 1A to 1D according to an embodiment of the present invention.

FIG. 2A shows briefly the waveforms of drive signals. The abscissa represents a time axis including alternately a read period RP and a transfer period TP. The ordinate of each signal waveform represents voltages: including as reference voltages a low voltage VL for forming a barrier under an electrode; a middle voltage VM for forming a charge accumulation region in a channel region under an electrode; and a high voltage VH for reading signal charge from the charge accumulation region to VCCD. A vertical sync signal VD and a horizontal sync signal HD define a vertical period and a horizontal period, respectively. Drive signals □V1 to □V4 to be applied to drive electrodes V1 to V4 have drive voltage waveforms as shown.

For example, VM, VH and VL are conventionally 0 V, +15 V and −8V, respectively. In this embodiment, the absolute value of the drive voltage VH among others can be lowered.

During the read period RP shown on the left, the drive voltage □V1 is usually a barrier forming voltage VL, and the drive voltages □V2 to □V4 are charge accumulation voltages. At the read timing, a read pulse is superposed upon the drive signal □V2 to take a voltage level VH and read charge from related charge accumulation regions. The read pulse VH lowers the potential of the read gate RG so that the barrier is extinguished and signal charge in the charge accumulation regions is read to VCCD.

Application of the read pulse raises the voltage level of the charge accumulation region and provides the tendency of raising the minimum depletion voltage. At a timing approximately synchronous with the read pulse, a cancellation pulse changing in a direction opposite to that of the read pulse is superposed upon the drive voltage □V3 at the transfer electrode spaced by one electrode from the electrode applied with the barrier forming voltage □V1, to set the voltage level, e.g., to VL. While the read pulse changes in a positive polarity, the cancellation pulse changes in a negative polarity so that a voltage level change of the charge accumulation region by the read pulse can be suppressed and the minimum depletion voltage can be lowered.

It is not necessary that the timing of the read pulse is correctly coincident with the timing of the cancellation pulse, but there may have an overlap period, if the cancellation pulse cancels out at least a portion of the influence of the read pulse and substantially the same effects of the charge transfer operation are obtained.

In the transfer period TP following the read period, the read charge is transferred from VCCD to HCCD one row after another, and HCCD transfers the charge at high speed one row after another toward the output amplifier OA which outputs image signals of one field.

In the next read period RP, the drive voltage □V1 is usually changed to VM, the drive voltage □V3 is changed to VL, and the read pulse is superposed upon the drive signal □V4. A cancellation pulse is superposed upon the drive voltage □V1 at the transfer electrode spaced by one electrode from the transfer electrode applied with the barrier forming voltage □V3. Signal charge in the charge accumulation regions not read in the preceding read period is read, and in the next transfer period TP, image signals of one field are output.

FIG. 2B shows a magnified drive voltage waveform during the read period while the read pulse is applied to the drive signal □V2. FIG. 2C shows a potential distribution relative to electrons in the vertical charge transfer channel at timings T1, T2 and T3. As described earlier, the magnitudes of the voltage and potential are reversed.

At the timing T1, □V2, □V3 and □V4 take the middle voltage VM and □V1 takes the low voltage VL. Therefore, a continuous potential well is formed under the electrodes V2, V3 and V4, and a potential barrier is formed under the electrode V1. It is assumed that smear charge exists in the potential well.

At the timing T2, the read pulse is superposed upon the drive voltage □V2 to take the high voltage level VH. Approximately synchronous with the read pulse, the cancellation pulse is superposed upon the drive voltage □V3 to take, e.g., the low voltage level VL. Since the VH is applied to the electrode V2, the potential barrier of the read gate extinguishes, and signal charge accumulated in the charge accumulation regions is read to VCCD. At the same time, the potential of the charge accumulation region tends to lower.

However, since the cancellation pulse is superposed upon the electrode V3, the interaction occurs to raise the potential of the charge accumulation region so that at least a portion of the influence of the read pulse can be cancelled out. The read pulse and cancellation pulse may be applied at the same timing as indicated by solid lines or one of them may lead as indicated by broken lines. Both the pulses have overlap portions with time and have the function of cancelling out the influences of both.

As the cancellation pulse is applied to the electrode V3 and the potential under the electrode V3 rises, smear charge under the electrode V3 flows toward both sides. On both sides of the electrode V3, there exist a deep potential well under the electrode V2 applied with the read pulse VH and a potential well under the electrode V4 applied with the charge accumulation voltage VM. Smear charge flowing toward either side is therefore trapped by these wells. Since the cancellation pulse applied electrode and the barrier forming voltage applied electrode are set remote from each other, smear charge will not move over the barrier.

At the timing T3, the read pulse and cancellation pulse are distinguished and the voltages at the electrodes V2 and V3 are set to VM same as that at the timing T1. The voltages at the electrodes V2, V3 and V4 are all set to the middle voltage VM, and the potential distribution under the electrodes recovers one continuous potential well. Charge separately stored in the two potential wells is again combined. As described above, even if a cancellation pulse is applied, smear charge is returned to the initial positions so that redistribution of smear charge can be prevented.

As above, redistribution of smear charge can be prevented by applying the cancellation pulse to the transfer electrode spaced apart by at least one transfer electrode from the transfer electrode applied with the barrier forming voltage. Even if smear charge moves from under the transfer electrode applied with the cancellation pulse, there are two transfer stages applied with potential well forming VM and VH on both sides of the electrode applied with the cancellation pulse. Therefore, the smear charge is trapped at these transfer stages and will not be redistributed.

In the case in which transfer electrodes made of two polysilicon layers are used and two transfer stages in one transfer unit of four stages are assigned to one charge accumulation region, if one transfer stage is used as the barrier forming transfer stage, only three transfer stages are left. Only the center transfer stage in the left three transfer stages can be applied with the read pulse with a gap of one transfer stage from the barrier forming transfer stage. If the transfer unit is three transfer stages or smaller, this driving method cannot be used.

Figure 5:
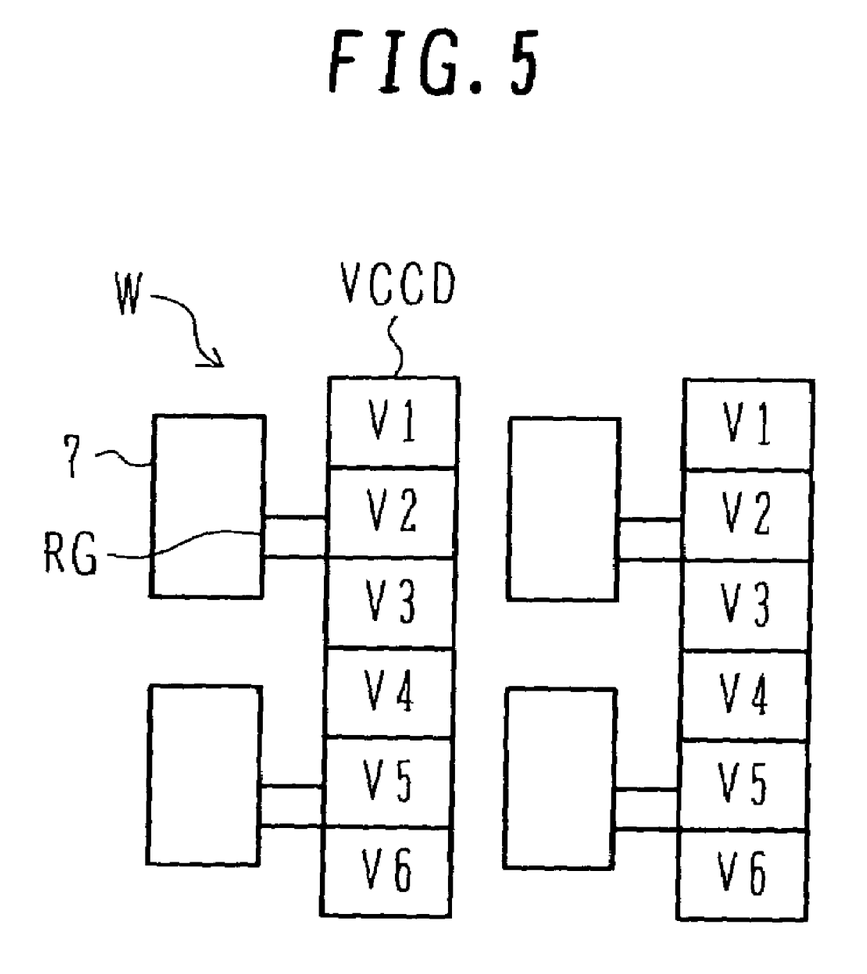
FIG. 5 is a plan view illustrating a driving method for a solid state image pickup device according to an embodiment of the present invention.

In the above description, transfer electrodes made of two polysilicon layers are used and two transfer stages are used for one charge accumulation region. It is also known that transfer electrodes made of three polysilicon layers are used and three transfer stages are used for one charge accumulation region. An example of this structure is shown in FIG. 5. Referring to FIG. 5, transfer stages V1 to V6 are defined in a vertical charge transfer channel VCCD under transfer electrodes V1 to V6. The effective arrangements of the transfer stages V1 to V6 and transfer electrodes V1 to V6 are coincident as viewed in plan.

For example, a first polysilicon layer is used for the transfer electrodes V1 and V4, a second polysilicon layer is used for the transfer electrodes V2 and V5, and a third polysilicon layer is used for the transfer electrodes V3 and V6. In a wiring area W, the first polysilicon layer is disposed as the lowermost layer, the second polysilicon layer is disposed above the first polysilicon layer, and the third polysilicon layer is disposed above the second polysilicon layer.

In this case, if six transfer stages are used as one transfer unit and one transfer stage is used as the barrier forming transfer stage, five transfer stages are left improving a selection degree of freedom. For example, a read pulse is applied to the transfer stage V2, a barrier forming voltage is applied to the transfer stage V1, and a cancellation pulse is applied to the transfer stage V4. The electrode V4 applied with the cancellation pulse is disposed spaced apart by two electrodes (V2 and V3) from the electrode V1 applied with the barrier forming voltage. The cancellation pulse may be applied to two or three transfer stages, and two or three transfer stages may be used as the barrier forming transfer stages.

In the above-described embodiment using two-layer polysilicon transfer electrodes, the electrode V3 applied with the cancellation pulse does not directly face the subject charge accumulation region so that the influence of the cancellation pulse is mitigated more than that the electrode V3 applied with the cancellation pulse directly faces the subject charge accumulation region. However, the influence of the cancellation pulse propagates to the charge accumulation region 7 via a p-type region such as the p-type well 2 under the electrode V3, which provides a function of preventing the potential change in the charge accumulation region 7. Therefore, the cancellation pulse can be applied to any electrode.

In a tetragonal matrix type solid state image pickup device in which polysilicon electrodes are stacked in a wiring area between adjacent pixels in a column direction, only the lowermost polysilicon electrode faces the p-type well in the wiring area. It is therefore expected more effective to use, as the cancellation pulse applied electrode, the first polysilicon electrode having a large area facing the p-type well, than to use the second or third polysilicon electrode.

In the example described with reference to FIG. 5, the cancellation pulse is applied to the electrode V4 made of the first polysilicon layer.

The above-described driving method is applied not only to the solid state image pickup device having photodiodes disposed in a tetragonal matrix shape, but also to other solid state image pickup devices. A pixel interleaved array (so-called a honeycomb array) is also known in which pixels are disposed at lattice points of a first tetragonal lattice and at inter-lattice points of the first tetragonal lattice (lattice points of a second tetragonal lattice). The first and second tetragonal lattices are shifted, for example, by a half pitch. For general information on the solid state image pickup device of this type, for example, refer to U.S. Pat. No. 6,236,434 which is incorporated herein by reference.

Figure 3A:
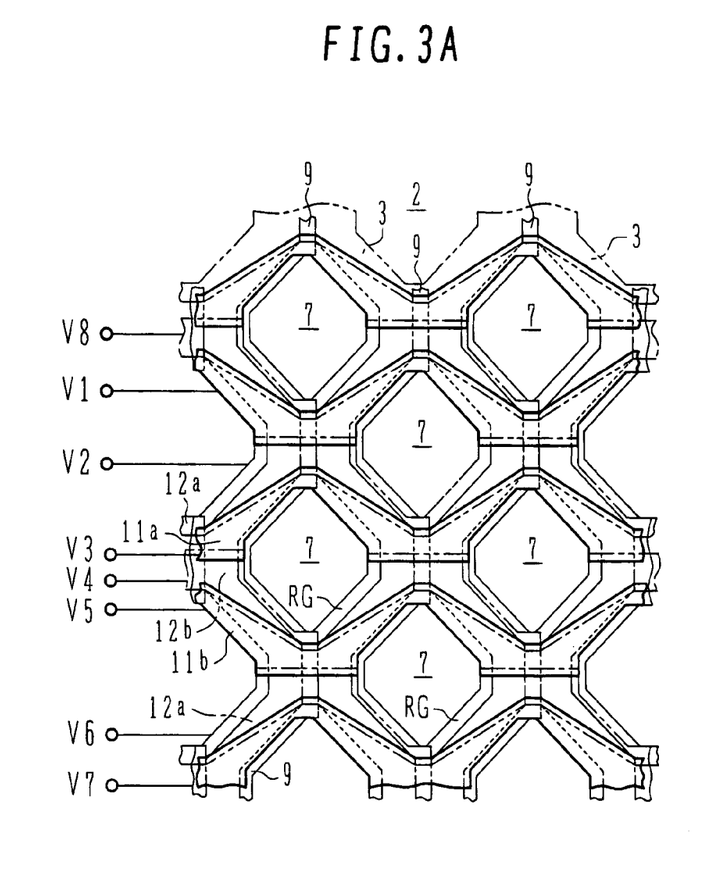
FIGS. 3A and 3B are a plan view and a graph illustrating a driving method for a solid state image pickup device according to an embodiment of the present invention.

FIG. 3A is a schematic plan view showing the structure of a solid state image pickup device of the pixel interleaved array (so-called a honeycomb array). Charge accumulation regions 7 are disposed by shifting a half pitch between adjacent columns and between adjacent rows. In the pixel interleaved array, rows are disposed which have no pixel at every second columns, and columns are disposed which have no pixel at every second rows.

A channel stop 9 is formed to the left of each column of charge accumulation regions 7, and to the right of each column, a transfer channel 3 of a vertical charge transfer channel is disposed. However, because of the pixel interleaved array, two transfer channels 3 are disposed between adjacent charge accumulation regions in the horizontal direction. These transfer channels 3 are electrically isolated by the channel stop 9.

Transfer electrodes 12a and 12b made of a first polysilicon layer and transfer electrodes 11a and 11b made of a second polysilicon layer are disposed covering the transfer channels 3 of the vertical charge transfer channels. Transfer stages are defined under the transfer electrodes. By forming the transfer electrodes shown in FIG. 3A in the pixel interleaved array, each transfer stage has a border not perpendicular but oblique to the extension direction of the channel at each transfer stage, to form a channel region whose width changes. It is known that such a transfer stage has an excellent transfer efficiency. A transfer stage having a border parallel to the channel extension direction is also possible.

Four transfer stages per one charge accumulation region are defined in the channel 3 of the vertical charge transfer channel. In reading divisional fields in a movie mode or the like, for example, charge in consecutive two rows is read, and charge in subsequent two rows is not read. A transfer unit is constituted of eight transfer stages. Description will be made on an operation of applying a read pulse, for example, to the electrodes V2 and V4 in order to read signal charge in the charge accumulation regions 7 at the second and third rows.

Figure 3B:
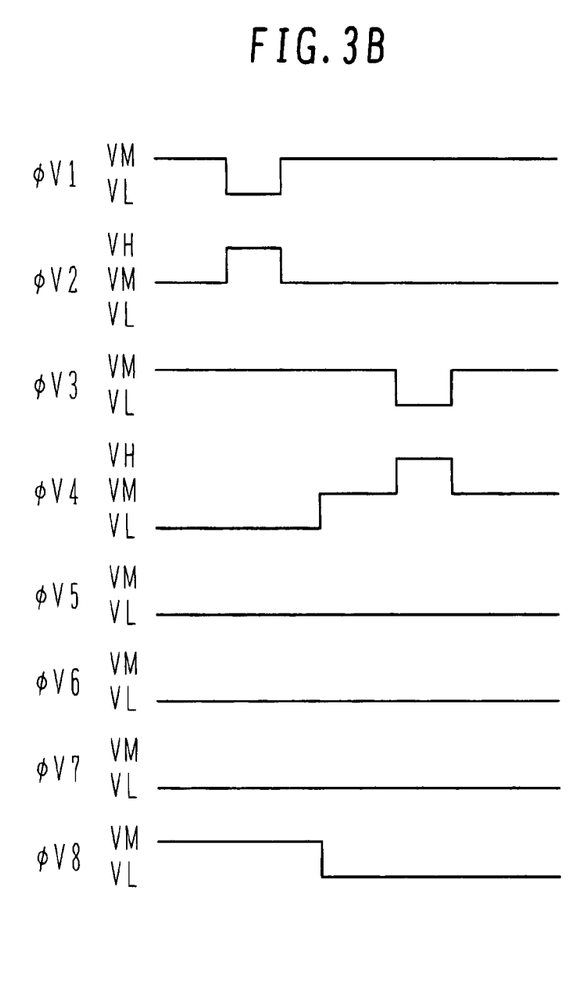

FIG. 3B shows briefly voltage waveforms of drive voltages □V1 to □V8 to be applied to the electrodes V1 to V8. First, the drive voltages □V4 to □V7 are set to a low voltage VL, and the drive voltages □V8 to □V3 are set to a middle voltage VM. At a read timing, a read pulse VH is superposed upon the drive voltage □V2, and a cancellation pulse is superposed upon the drive voltage □V1. With the read pulse applied to the drive voltage □V2, charge are read from the charge accumulation regions 7 at the second row to the transfer channels 3 of VCCDs over the read gates.

At this time, the cancellation pulse is applied to the upper side adjacent electrode V1. Smear charge under the electrode V1 flows along up/down directions. Since the middle voltage VM is applied to the electrode V8, smear charge flowed upward is trapped by an adjacent potential well. Since the read pulse is applied to the lower adjacent electrode V2, smear charge flowed downward is stored in the deep potential well together with signal charge. As the read pulse and cancellation pulse extinguish, the two potential wells are combined to form one potential well so that the smear charge is combined in the initial state.

At a later timing, the drive voltage □V4 at the electrode V4 is changed from the low voltage VL to the middle voltage VM, and the drive voltage □V8 at the electrode V8 is changed from the middle voltage VM to the low voltage VL. The well is therefore moved to the downstream side by one transfer stage. Thereafter, a read pulse VH is superposed upon the drive voltage □V4 at the electrode V4, and a cancellation pulse is superposed upon the drive voltage □V3 at the electrode V3.

Smear charge under the electrode V3 flowed in up/down directions is trapped by a deep potential well under the electrode V4 or by a potential well under the electrodes V2 and V1. As the read pulse and cancellation pulse distinguish thereafter, the smear charge divided into two parts is combined in the initial state.

As described above, potential wells are positively formed on both sides of the electrode applied with the cancellation pulse so that even if smear charge flows, it is prevented from being mixed with neighboring signal charge and the smear charge is combined with the signal charge after the read pulse and cancellation pulse are extinguished. In this manner, image signals without smear can be obtained. Selecting the cancellation pulse applied transfer stage spaced from the barrier forming transfer stage is not limited to the above embodiment, but changed in various ways, because there are four transfer stages per one charge accumulation region and eight transfer stages per one transfer unit.

The present invention has been described in connection with the preferred embodiments. The invention is not limited only to the above embodiments. For example, four-phase drive is possible for the pixel interleaved array. It will be apparent to those skilled in the art that other various modifications, improvements, combinations, and the like can be made.

We claim:

1. A driving method for a solid state image pickup device having a number of charge accumulation regions formed in a surface region of a first conductivity type in a semiconductor substrate in a matrix shape, said charge accumulation region being of a second conductivity type opposite to said first conductivity type, a plurality of vertical charge transfer channels of said second conductivity type formed adjacent to each column of said charge accumulation regions in said surface region, a read gate of said first conductivity type disposed in said surface region between each charge accumulation region and a corresponding vertical charge transfer channel, and a plurality of transfer electrodes, constituting four or more transfer stages as one transfer unit, disposed above each vertical charge transfer channel, crossing each vertical charge transfer channel, extending in a row direction, defining two or more transfer stages per one charge accumulation region in said vertical charge transfer channels, being capable of transferring charge by selectively applying a barrier forming voltage and a charge accumulation voltage and reading signal charge from a charge accumulation region to a transfer stage by applying a read pulse to the transfer stage corresponding to said read gate, the driving method comprising the steps of:

(a) focussing an optical image on said charge accumulation regions to accumulate signal charge;

(b) reading signal charge from said charge accumulation regions to said vertical charge transfer channels, said reading step comprising the steps of:

(b-1) applying the barrier forming voltage to a first transfer electrode to form a barrier of at least one stage per the transfer unit;

(b-2) applying the read pulse to a second transfer electrode to read signal charge from a corresponding charge accumulation region to a corresponding vertical charge transfer channel; and (b-3) applying a cancellation pulse to a third transfer electrode spaced by at least one transfer stage from the first transfer electrode, cancellation pulse cancelling out a potential change in the charge accumulation region to be caused by the read pulse.

2. A driving method for a solid state image pickup device according to claim 1, wherein said number of charge accumulation regions are disposed in a tetragonal matrix shape, the number of transfer stages per each charge accumulation region is two or three, and said transfer unit is four or six transfer stages.

3. A driving method for a solid state image pickup device according to claim 2, wherein said transfer electrode is made of a plurality of conductive layers and the transfer electrode applied with said cancellation pulse includes a lowest conductive layer.

4. A driving method for a solid state image pickup device according to claim 1, wherein said charge accumulation regions in the matrix shape are disposed at lattice points and inter-lattice of a first square lattice.

5. A driving method for a solid state image pickup device according to claim 4, wherein the number of transfer stages per each charge accumulation region is four, and said transfer unit is eight transfer stages.

6. A driving method for a solid state image pickup device according to claim 1, wherein said cancellation pulse is substantially equal to said barrier forming voltage.

7. A driving method for a solid state image pickup device according to claim 2, wherein said cancellation pulse is substantially equal to said barrier forming voltage.

8. A driving method for a solid state image pickup device according to claim 3, wherein said cancellation pulse is substantially equal to said barrier forming voltage.

9. A driving method for a solid state image pickup device according to claim 4, wherein said cancellation pulse is substantially equal to said barrier forming voltage.

10. A driving method for a solid state image pickup device according to claim 5, wherein said cancellation pulse is substantially equal to said barrier forming voltage.

* * * * *